United States Patent
Iizuka et al.

(10) Patent No.: US 10,209,374 B2
(45) Date of Patent: Feb. 19, 2019

(54) RADIATION DETECTOR

(71) Applicant: SHARP KABUSHIKI KAISHA, Sakai, Osaka (JP)

(72) Inventors: Kunihiko Iizuka, Sakai (JP); Katsuhisa Kashiwagi, Sakai (JP); Shigenari Taguchi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/741,271

(22) PCT Filed: Jun. 9, 2016

(86) PCT No.: PCT/JP2016/067283
§ 371 (c)(1),
(2) Date: Dec. 31, 2017

(87) PCT Pub. No.: WO2017/010202
PCT Pub. Date: Jan. 19, 2017

(65) Prior Publication Data
US 2018/0203137 A1  Jul. 19, 2018

(30) Foreign Application Priority Data
Jul. 13, 2015  (JP) .................................. 2015-139940

(51) Int. Cl.
| H01L 27/146 | (2006.01) |
| G01T 1/24 | (2006.01) |
| H01L 27/144 | (2006.01) |
| H04N 5/32 | (2006.01) |
| H04N 5/378 | (2011.01) |

(52) U.S. Cl.
CPC ............ *G01T 1/247* (2013.01); *H01L 27/144* (2013.01); *H01L 27/146* (2013.01); *H01L 27/14659* (2013.01); *H04N 5/32* (2013.01); *H04N 5/378* (2013.01)

(58) Field of Classification Search
CPC ................................................. H01L 27/14609
See application file for complete search history.

(56) References Cited

U.S. PATENT DOCUMENTS

2004/0135911 A1  7/2004  Nathan et al.
2010/0237228 A1*  9/2010  Reshef .............. H01L 27/14609
250/214 A

FOREIGN PATENT DOCUMENTS

| EP | 2330625 A2 | 6/2011 |
| JP | H10-281870 A | 10/1998 |
| WO | 2006/072848 A1 | 7/2006 |

OTHER PUBLICATIONS

Supplementary European Search Report dated Jul. 3, 2018 in European Application No. 16824182.

* cited by examiner

*Primary Examiner* — Yara B Green
(74) *Attorney, Agent, or Firm* — ScienBiziP, P.C.

(57) ABSTRACT

A detectable range for an output signal corresponding to charge stored at a pixel is widened in a radiation detector based on an APS method. A resistor (42) is connected to a region between a pixel (12) and a signal readout circuit (21) in a signal output line (51). The resistor (42) is set so as to draw, from the signal output line (51), a current approximately equivalent to a bias current which flows to an amplifier transistor (16) when no charge is stored in a charge storage part (14).

5 Claims, 8 Drawing Sheets

100: PIXEL
101: PHOTODIODE
102: CHARGE STORAGE PART
103: READOUT SWITCH
104: PIXEL RESET SWITCH
105: AMPLIFIER TRANSISTOR
110: PIXEL OUTPUT LINE
120: READOUT CIRCUIT
121: AMPLIFIER RESET SWITCH
122: FEEDBACK CAPACITOR
123: READOUT AMPLIFIER
130: READOUT AMPLIFIER OUTPUT LINE

RADIATION DETECTOR

TECHNICAL FIELD

The present invention relates to a radiation detector for detecting radiation, such as X-rays.

BACKGROUND ART

A radiation detector using a solid state device, such as an image sensor, has recently been under development as a radiation detector which detects radiation, such as X-rays, instead of a conventional radiation detection system using an intensifying screen and an X-ray film.

Radiation detectors (radiation image capturers) using a thin film transistor (TFT) panel, in particular, are being actively developed because the radiation detectors have the advantage of being lensless and the advantage of being suitable for large-screen image capturing, as compared to an image sensor, such as a charge coupled device (CCD) or a complementary metal-oxide semiconductor device (CMOS).

A radiation detector using a TFT panel includes an image capturing circuit having a large number of pixels two-dimensionally arranged. Each pixel converts a physical quantity corresponding to the dose of X-rays (the dose of radiation) into a signal and measures the signal obtained through the conversion, thereby performing image capturing.

Methods for reading out signals obtained through conversion at pixels in the radiation detector using the TFT panel are broadly classified into two types.

One method is reading out the amount of charge (the amount of carriers) stored at each pixel without any change and is called a passive pixel sensor (PPS) method.

The other method is generating a potential or a current corresponding to the amount of charge stored at each pixel and reading out the generated potential or current and is called an active pixel sensor (APS) method.

The potential of each pixel is reset with each readout in a panel based on the PPS method of the two methods. The panel based on the PPS method is thus relatively easy to use and has been put into practical use ahead of the APS method. Note that a readout circuit for the PPS method for reading out the amount of charge stored at each pixel has also been put into practical use. The readout circuit for the PPS method is generally created by a CMOS process or the like separately from the TFT panel and is connected to the TFT panel via a flexible board.

FIG. 7 is an explanatory diagram showing an example of the configurations of one pixel 100 and a readout circuit 120 connected to the pixel 100 in a conventional radiation detector based on the PPS method.

The pixel 100 includes a photodiode 101, a charge storage part (charge storage node) 102, and a readout switch 103. The photodiode 101 photoelectrically converts light (radiation) in a predetermined frequency band which is incident from the outside and stores charge generated through the photoelectric conversion in the charge storage part 102. With this configuration, charge corresponding to the amount of light incident on the photodiode 101 is stored in the charge storage part 102.

One end side of the readout switch 103 is connected to the charge storage part 102, and the other end side is connected to a signal output line 110. The readout switch 103 switches between a state of continuity between the charge storage part 102 and the signal output line 110 and a state of discontinuity in accordance with an instruction from control means (not shown).

The readout circuit 120 includes an amplifier reset switch 121, a feedback capacitor 122, and a readout amplifier 123. The signal output line 110, one end side of the feedback capacitor 122, and one end side of the amplifier reset switch 121 are connected to an input terminal of the readout amplifier 123. A readout amplifier output line 130, the other end side of the feedback capacitor 122, and the other end side of the amplifier reset switch 121 are connected to an output terminal of the readout amplifier 123.

If the readout switch 103 is switched to the state of continuity, charge corresponding to the amount ($Q_{sig}$) of charge stored in the charge storage part 102 is stored in the feedback capacitor 122 ($C_F$) connected in parallel with the readout amplifier 123. As a result, an output potential $V_{out}$ from the readout amplifier 123 to the readout amplifier output line 130 is an output potential corresponding to the amount of charge stored in the photodiode 101, as given by Expression (1) below.

$$V_{out}=Q_{sig}/C_F \quad (1)$$

At this time, the potential of the signal output line 110 is set to a predetermined potential through feedback from the readout amplifier 123. After the readout, the readout switch 103 is opened (turned off), continuity between the charge storage part 102 and the signal output line 110 is broken, and signals obtained through photoelectric conversion are stored in the charge storage part 102 again.

To implement a further reduction in the dose of a detectable range or a further increase in the resolution in the detectable range in a radiation detector, an SN ratio needs to be increased. For an increase in the SN ratio, the APS method is considered promising, as described in, for example, PTL 1.

In the PPS method, an output from each pixel is a charge amount. In the APS method, an output is generally a current amount. A charge integration circuit is generally used as a readout circuit which reads out an output from each pixel.

Since a signal is charge itself stored at a pixel in the PPS method, a readout circuit is required to have the ability to accurately read out charge.

In contrast, in the case of the APS method, an output signal from a pixel is a current. Lengthening of an integral time leads to obtainment of a larger signal than in a readout circuit based on the PPS method if the efficiency of conversion from the same amount of light (radiation) into charge is the same.

However, there is a problem in that, when a radiation detector based on the APS method is operated, noise occurs in a finally obtained image if there is variation in initial state among pixels. For this reason, in the radiation detector based on the APS method, pixels are need to be initialized (reset) at the beginning of use or periodically.

Note that, for example, the method disclosed in PTL 2 can be used as a method for determining an operating point at the time of the initialization operation. The method in PTL 2 is giving feedback such that an output from a given pixel is equal to a reference voltage when the pixel is selected. In the method in PTL 2, a current flowing in a pixel is determined by a load transistor.

CITATION LIST

Patent Literature

PTL 1: U.S. Patent Application Publication No. 2004/0135911 (on Jul. 15, 2004)

PTL 2: Japanese Unexamined Patent Application Publication No. 10-281870 (laid-open on Oct. 23, 1998)

SUMMARY OF INVENTION

Technical Problem

Use of a readout circuit based on the PPS method as a readout circuit for a radiation detector based on the APS method is conceivable. FIG. 8 shows a configuration in a case where the readout circuit based on the PPS method shown in FIG. 7 is applied to a pixel based on the APS method. Note that the configuration shown in FIG. 8 is devised by the inventor of the present application and is not a publicly known technique.

In the configuration shown in FIG. 8, each pixel 100 includes a pixel reset switch 104 which is connected to the charge storage part 102 and an amplifier transistor 105 which is connected between the charge storage part 102 and the readout switch 103, in addition to the components of the pixel 100 shown in FIG. 7.

The pixel reset switch 104 is switched to a state of continuity when a reference voltage for the photodiode 101 is to be set. That is, the pixel reset switch 104 is a switch for resetting the potentials of the photodiode 101 and the charge storage part 102 to a reset potential corresponding to a predetermined reference voltage. Resetting of the potentials of the photodiode 101 and the charge storage part 102 is performed with each readout of a current corresponding to the amount of charge stored in the charge storage part 102 or every predetermined number of readouts.

The amplifier transistor 105 converts a voltage signal corresponding to charge stored in the charge storage part 102 into a current signal and outputs the current signal to the signal output line 110 via the readout switch 103.

When light is incident on the photodiode 101, the photodiode 101 performs photoelectric conversion, charge is stored in the charge storage part 102, and the potential of the charge storage part 102 changes from the reset potential. When the readout switch 103 becomes electrically continuous after that, the amplifier transistor 105 functions as a grounded-drain amplifier and outputs a current corresponding to the changed potential. At this time, the signal output line 110 is set to a predetermined potential through feedback from the readout amplifier 123.

If readout processing is performed for a time t, charge for current×time t is stored in the feedback capacitor 122 for the readout amplifier 123.

Letting $Q_{sig}$ be a signal charge, $C_{PD}$ be the capacitance of the photodiode 101, $g_m$ be mutual conductance of the amplifier transistor 105, $I_B$ be a bias current flowing to the amplifier transistor 105 at the reset potential, t be an integral time, and $C_F$ be a capacitance value of the feedback capacitor 122, an output potential $V_{out}$ from the readout amplifier 123 is given by Expression (2) below.

$$V_{out} = (g_m \cdot Q_{sig}/C_{PD} + I_B) \cdot t/C_F \quad (2)$$

Through computation of the expression, an output corresponding to the amount of charge stored in the charge storage part 102 by the photodiode 101 is read out. When the readout ends after a lapse of the time t, the readout switch 103 is opened, and signals obtained through photoelectric conversion are stored in the charge storage part 102 again.

As described above, in a readout circuit based on the APS method, a current value corresponding to a change in potential from the reset potential is an intended output signal.

However, even if a change in potential from the reset potential is 0, continuity of the readout switch 103 causes the bias current $I_B$ to flow from the amplifier transistor 105 to the signal output line 110 to change an output from the readout amplifier 123. For this reason, there is a problem in that the readout circuit 120 can operate only within a range where a change in the output from the readout amplifier 123 due to the bias current $I_B$ does not saturate an output from the readout amplifier 123.

The present invention has been made in view of the above-described problem, and has as its object to widen a detectable range for an output signal corresponding to charge stored at a pixel in a radiation detector based on the APS method.

Solution to Problem

A radiation detector according to one aspect of the present invention is a radiation detector including a pixel having a charge storage part which stores charge corresponding to the dose of radiation and a current signal generation part which generates a current signal corresponding to the amount of charge stored in the charge storage part, a signal output line which is connected to the pixel, and a signal readout circuit which reads out the current signal input from the pixel via the signal output line, in which the radiation detector includes a current adjustment part which is connected to a region between the pixel and the signal readout circuit in the signal output line, and the current adjustment part draws or feeds, from or into the signal output line, a current approximately equivalent to a bias current which flows to the current signal generation part when no charge is stored in the charge storage part.

Advantageous Effects of Invention

According to the above-described configuration, influence of the bias current flowing to the current signal generation part on the current signal input to the signal readout circuit can be eliminated by simply connecting the current adjustment part to the signal output line. This makes it possible to widen, with a simple configuration, a detectable range for a current signal corresponding to the amount of charge stored in the charge storage part.

DESCRIPTION OF EMBODIMENTS

[First Embodiment]

An embodiment of the present invention will be described.

(1-1. Overall Configuration of Radiation Detector 1)

Figure 1:
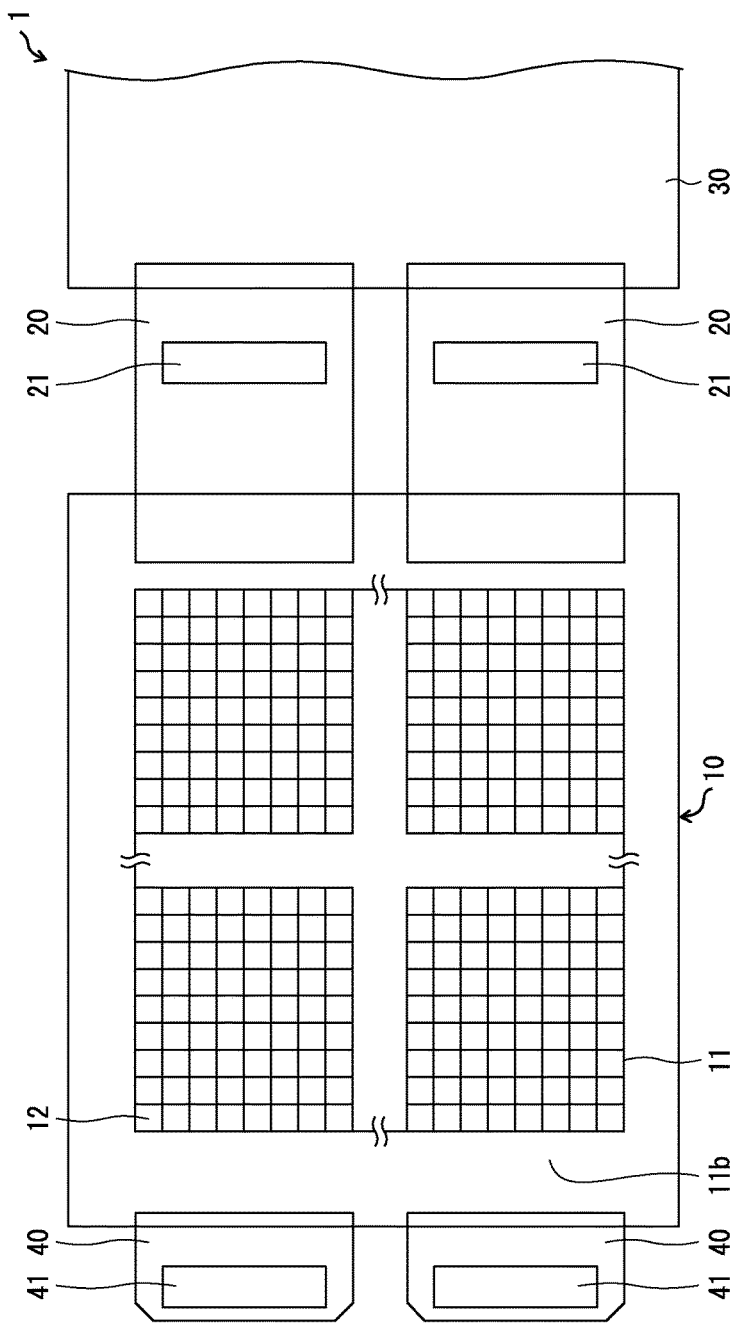
FIG. 1 is an explanatory diagram showing a schematic configuration of a radiation detector according to a first embodiment of the present invention.

FIG. 1 is an explanatory diagram showing a schematic configuration of a radiation detector 1 according to the present embodiment. As shown in the diagram, the radiation detector 1 includes a pixel board 10, a flexible printed board (FPC board) 20, a signal processing circuit board 30, and an FPC board 40.

The pixel board 10 is a glass board in a substantially rectangular shape, and a pixel region 11 having a plurality of pixels 12 formed in a matrix (an array) and a non-pixel region 11b without the pixel 12 are formed on a board surface of the pixel board 10. Note that the pixel region 11 is arranged at a central portion of the board surface of the pixel board 10 and that the non-pixel region 11b is arranged around a peripheral portion of the board surface of the pixel board 10 so as to surround the pixel region 11. Note that the material for the pixel board 10 is not limited to glass and may be, for example, resin. The shapes of the pixel board 10 and the pixel region 11 are not limited to rectangular shapes and may be arbitrary shapes.

The FPC board 20 is arranged so as to connect one end portion of the pixel board 10 and one end portion of the signal processing circuit board 30. A signal readout circuit 21 is formed on the FPC board 20. An existing readout circuit used as a readout circuit for a PPS method is used as the signal readout circuit 21. Note that although two FPC boards 20 having the respective signal readout circuits 21 are provided in the present embodiment, the number of FPC boards 20 is not limited to this.

The signal processing circuit board 30 acquires an output signal corresponding to charge stored at each pixel from the signal readout circuit 21 and calculates the doses of radiation incident on the respective pixels, distribution of the doses of radiation in the pixel region 11, and the like in accordance with the acquired output signals from the pixels.

The FPC board 40 is connected to the other end portion (an end portion on the opposite side across the pixel region 11 from an end portion, to which the FPC board 20 is connected, in the pixel board 10) of the pixel board 10. A resistor array IC (a current adjustment part) 41 is formed on the FPC board 40. In the present embodiment, a signal output line 51 (see FIG. 2 (to be described later)) which connects each pixel 12 and the signal readout circuit 21 extends along a direction (a longitudinal direction of the pixel board 10; a lateral direction in FIG. 1) parallel to a direction, in which the FPC board 20 and the FPC board 40 face each other. Note that although two FPC boards 40 having the respective resistor array ICs 41 are connected to the pixel board 10 in the present embodiment, the number of FPC boards 40 is not limited to this.

(1-2. Configurations of Pixel, Resistor Array, and Readout Circuit)

Figure 2:
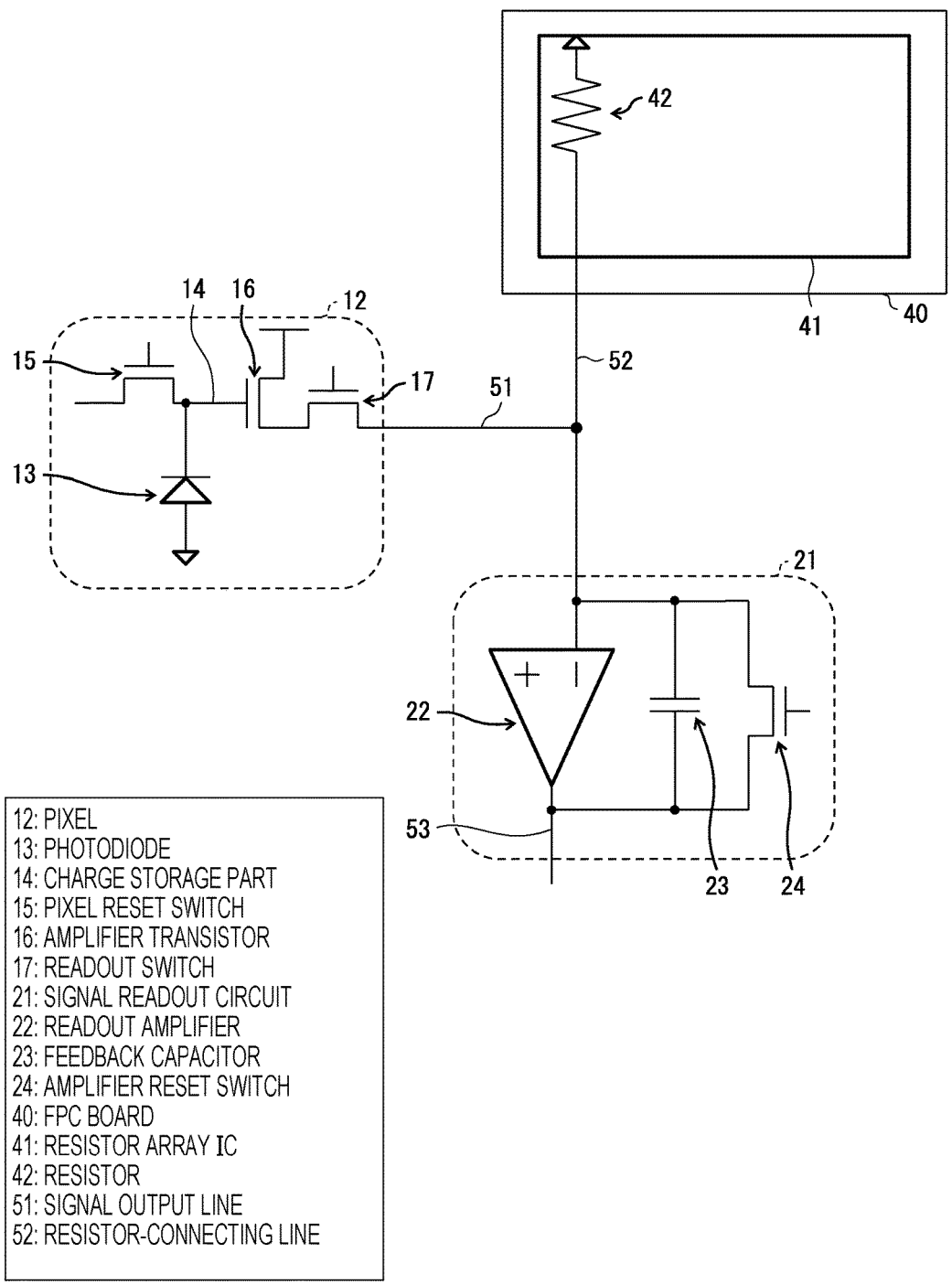
FIG. 2 is an explanatory diagram showing the configurations of a pixel, a current adjustment part, and a readout circuit included in the radiation detector shown in FIG. 1.

FIG. 2 is an explanatory diagram showing the configurations of the pixel 12, the resistor array IC 41, and the signal readout circuit 21. Note that FIG. 2 shows only one of a large number of pixels 12 arranged in the pixel region 11, one corresponding to the one pixel 12 of a plurality of resistors (current setting resistors) 42 included in the resistor array IC 41, and a portion connected to the one pixel 12 of the signal readout circuit 21.

As shown in FIG. 2, the pixel 12 includes a photodiode 13, a charge storage part (charge storage node) 14, a pixel reset switch 15, an amplifier transistor (current signal generation part) 16, and a readout switch 17.

The photodiode 13 photoelectrically converts light in a predetermined frequency band (radiation, such as X-rays) which is incident on the pixel 12 and outputs charge generated through the photoelectric conversion to the charge storage part 14. In this manner, charge corresponding to the amount of incident light on the photodiode 13 of the light in the predetermined frequency band is stored in the charge storage part 14.

The pixel reset switch 15 is a switch for resetting the potentials of the photodiode 13 and the charge storage part 14 to a predetermined reset potential. The pixel reset switch 15 is connected to a control part (not shown) of the radiation detector 1 and operates to open or close in accordance with an instruction from the control part. The control part closes the pixel reset switch 15 with each readout of a current corresponding to the amount of charge stored in the charge storage part 14 or every predetermined number of readouts. When the pixel reset switch 15 is closed, a potential supply source (not shown) which supplies the reset potential and the charge storage part 14 become electrically continuous, and the potentials of the photodiode 13 and the charge storage part 14 are reset to the reset potential.

The amplifier transistor 16 converts a voltage signal corresponding to charge stored in the charge storage part 14 into a current signal and outputs the current signal to the signal output line 51 via the readout switch 17.

The readout switch 17 is connected to the control part (not shown) of the radiation detector 1 and operates to open or close in accordance with an instruction from the control part. The control part closes the readout switch 17 each time predetermined timing is provided to output a current corresponding to the amount of charge stored in the charge storage part 14 to the signal output line 51.

The signal output line 51 has one end connected to the readout switch 17 of the pixel 12 and the other end connected to a portion corresponding to the pixel 12 of the signal readout circuit 21.

One of the plurality of resistors (current adjustment parts) 42 included in the resistor array IC 41 is connected to the signal output line 51 via a resistor-connecting line 52. More specifically, the resistor 42, a resistance value and an end-to-end potential difference of which are set such that a bias current $I_B$ flowing to the amplifier transistor 16 of the pixel 12 at the reset potential flows to the resistor 42 when the readout switch 17 is closed, is selected as the resistor 42 to be connected to the signal output line 51 corresponding to the pixel 12. With this configuration, in the present embodiment, a current approximately equivalent to the bias current $I_B$ flowing to the amplifier transistor 16 flows to the resistor 42 and does not flow to the feedback capacitor 23 when the readout switch 17 is closed.

The signal readout circuit 21 includes a readout amplifier 22, a feedback capacitor 23, and an amplifier reset switch 24. The signal output line 51, one end side of the feedback capacitor 23, and one end side of the amplifier reset switch 24 are connected to an input stage of the readout amplifier 22. A readout amplifier output line 53, the other end side of the feedback capacitor 23, and the other end side of the amplifier reset switch 24 are connected to an output stage of the readout amplifier 22. The readout amplifier output line 53 is also connected to a computation part (not shown) included in the signal processing circuit board 30. With this configuration, a signal read out from the pixel 12 by the readout amplifier 22 is transmitted to the computation part included in the signal processing circuit board 30, and the computation part (not shown) of the signal processing circuit board 30 performs predetermined processing (for example, calculation of the doses of radiation incident on the respective pixels 12, calculation of distribution of the doses of radiation in the pixel region 11, and the like) on the basis of signals read out from the pixels 12.

(1-3. Operation of Pixel, Resistor Array, and Readout Circuit)

As described above, in the present embodiment, a resistance value and an end-to-end potential difference of the resistor 42 connected to the signal output line 51 corresponding to each pixel 12 are set such that a current approximately equalized with the bias current $I_B$ that flows to the amplifier transistor 16 of the pixel 12 when the potential of the charge storage part 14 is the reset potential flows to the resistor 42 when the readout switch 17 is closed. With this configuration, the present embodiment can prevent the bias current $I_B$ from being input to the readout amplifier 22. This allows widening of a detectable range for an output signal from the pixel 12 in the readout amplifier 22.

The above-described respect will be described in more detail. First, let $V_{RESET}$ be the potential (the reset potential) of the charge storage part 14 at the time of resetting. Assume that the on resistance of the readout switch 17 is negligible. In this case, when the readout switch 17 is closed in a state with no signal (a state with no charge stored in the charge storage part 14) (the readout switch 17 is turned on), an output current to be output to the signal output line 51 is the bias current $I_B$ of the amplifier transistor 16 and is represented by Expression (3) below.

$$I_B = \beta/2 \cdot (V_{RESET} - V_{REF} - V_{th})^\alpha \quad (3)$$

In the present embodiment, a resistance value R of the resistor 42 is set so as to generally satisfy Expression (4) below. Note that the potential of the signal output line 51 converges on a predetermined potential through feedback from the readout amplifier 22 and that a predetermined potential difference is applied to the resistor 42.

$$R = V_{REF}/I_B \quad (4)$$

For this reason, a current which flows into the feedback capacitor 23 when the readout switch 17 is closed in the state with no signal (the state with no charge stored in the charge storage part 14) is approximately 0.

Letting $Q_{SIG}$ be a signal charge amount and $C_{PD}$ be the capacitance of the charge storage part 14, the amount $V_{SIG}$ of change in potential of the charge storage part 14 in a state with a signal (a state with charge stored in the charge storage part 14) is represented by Expression (5) below.

$$V_{SIG} = Q_{SIG}/C_{PD} \quad (5)$$

Letting $g_m$ be mutual conductance of the amplifier transistor 16, the amount $I_{SIG}$ of increase in a current corresponding to the amount of charge stored in the charge storage part 14 is given by Expression (6) below.

$$I_{SIG} = g_m \cdot V_{SIG} \quad (6)$$

A total output current from the readout switch 17 to the signal output line 51 is $I_B + I_{SIG}$.

Since the resistor 42 is provided, a current approximately equalized with the bias current $I_B$ flows to the resistor 42 and is not stored in the readout amplifier 22. For this reason, an output potential $V_{OUT}$ from the readout amplifier 22 to the readout amplifier output line 53 is given by Expression (7) below.

$$V_{OUT} = g_m \cdot t/C_F \cdot V_{SIG} \quad (7)$$

When the readout ends, the readout switch 17 is opened (the readout switch 17 is turned off), and signals obtained through photoelectric conversion are stored in the photodiode 13 and the charge storage part 14 again.

It can be seen from comparison between Expression (2) above and Expression (7) above that the connection of the resistor 42 to the signal output line 51 allows utilization of a dynamic range that is more effective by an amount corresponding to Expression (8) below. That is, the connection of the resistor 42 to the signal output line 51 makes it possible to perform APS-method-based readout using the conventional signal readout circuit 21 for the PPS method while reducing loss in dynamic range.

$$V_{out} = I_B \cdot t/C_F \quad (8)$$

As described above, the radiation detector 1 according to the present embodiment includes the pixel 12 having the amplifier transistor 16 that converts a voltage signal corresponding to charge stored in the charge storage part 14 into a current signal, the signal readout circuit 21 that reads out a current signal output from the amplifier transistor 16, and the signal readout circuit 21 that reads out a current signal input from the pixel 12 via the signal output line 51. The resistor 42 is connected to the signal output line 51. The resistance value and the end-to-end potential difference of the resistor 42 are set such that a current approximately equalized with the bias current $I_B$ that flows to the amplifier transistor 16 when zero charge is stored in the charge storage part 14 flows to the resistor 42.

It is thus possible to curb influence of the bias current $I_B$ on an output from the signal readout circuit 21, reduce loss in dynamic range in the readout amplifier 22, and widen a detectable range for an output signal from the pixel 12.

Additionally, connection of the resistor 42 to the signal output line 51 is all that is needed, and the configurations of the pixel 12 and the signal readout circuit 21 need not be changed. The detectable range of the readout amplifier 22 can be widened with a simple configuration. APS-method-based readout can be performed using an existing readout circuit for the PPS method.

In the present embodiment, the FPC board 20 having the signal readout circuit 21 is connected to one end side of the pixel board 10, and the FPC board 40 having the resistor array IC 41 formed thereon is connected to a region outside the pixel region 11 on the other end side of the pixel board 10.

With the above-described configuration, heat generated in the resistor array IC 41 can be prevented from influencing the operation of each pixel 12 provided in the pixel region 11. That is, since a current corresponding to the bias current $I_B$ that flows to the amplifier transistor 16 flows to each resistor 42 included in the resistor array IC 41, heat may be generated. Meanwhile, the pixel 12 is composed of elements, such as a diode and a TFT, and an operating characteristic of the pixel 12 has temperature dependence.

In contrast, in the present embodiment, the resistor array IC 41 is arranged at a position (the non-pixel region 11b) separate from the pixel region 11. Even if the resistor array IC 41 generates heat, the operation of each pixel 12 can be stabilized by reducing a change in temperature of the pixel 12 and reducing noise in an output signal from the pixel 12.

Although the present embodiment has described a configuration in which the FPC board 40 having the resistor array IC 41 formed thereon is connected to the pixel board 10, the present invention is not limited to this. For example, the resistor array IC 41 may be directly connected to the pixel board 10 through soldering or the like. Alternatively, the resistor array IC 41 may be formed on a rigid board, such as a glass board or a resin board, and the board having the resistor array IC 41 formed thereon may be connected to the pixel board 10.

[Second Embodiment]

Another embodiment of the present invention will be described. Note that, for convenience of illustration, members having the same functions as those described in the above embodiment are denoted by the same reference characters and that a description thereof will be omitted.

Figure 3:
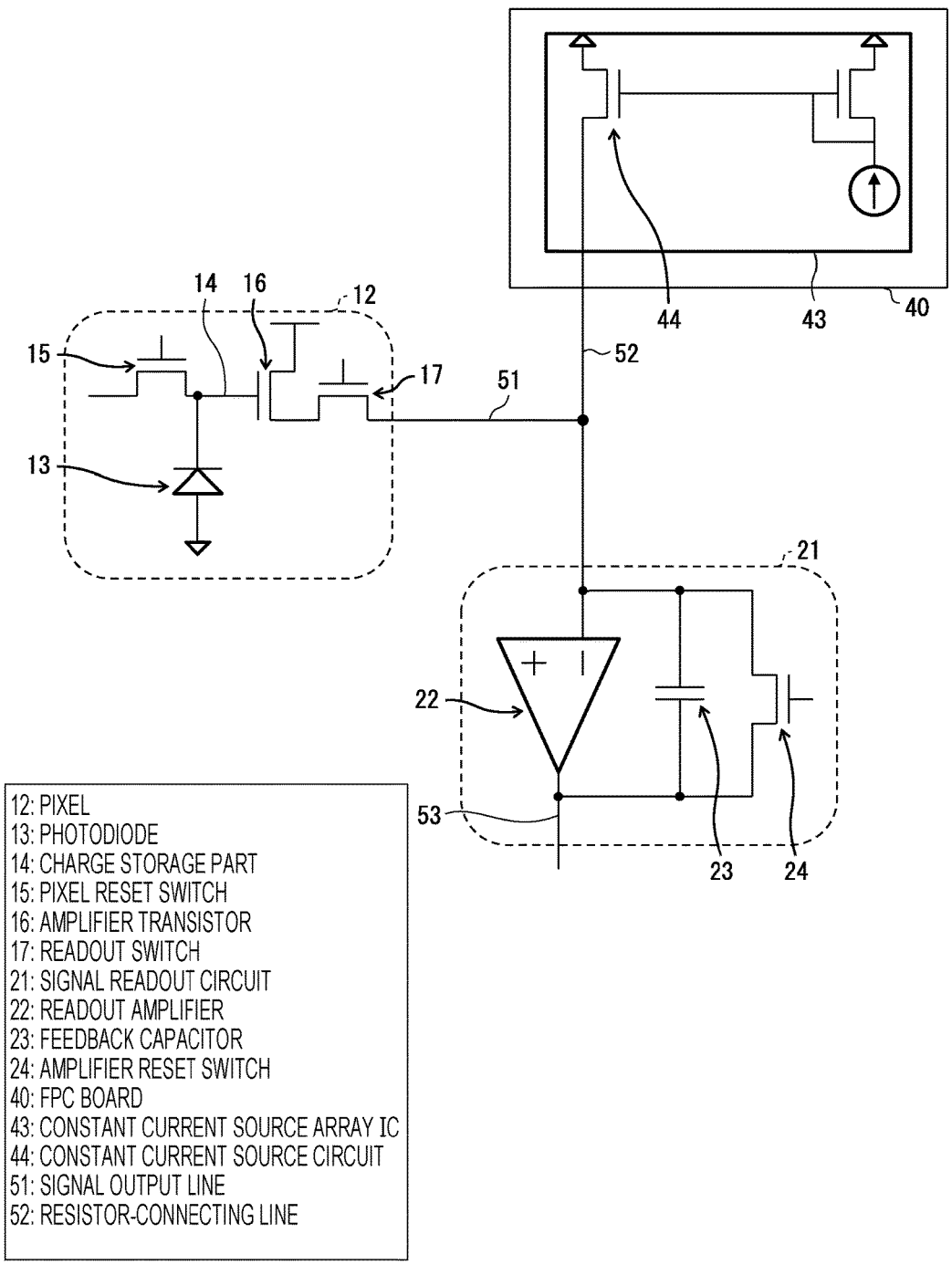
FIG. 3 is an explanatory diagram showing the configurations of a pixel, a current adjustment part, and a readout circuit included in a radiation detector according to a second embodiment of the present invention.

FIG. 3 is an explanatory diagram showing the configurations of a pixel 12, a constant current source array IC (current adjustment part) 43, and a signal readout circuit 21 in a radiation detector 1 according to the present embodiment. As shown in FIG. 3, the radiation detector 1 according to the present embodiment is different from the radiation detector 1 according to the first embodiment in that the constant current source array IC 43 is provided instead of the resistor array IC 41. Note that the constant current source array IC 43 is provided on an FPC board 40 instead of the resistor array IC 41.

The constant current source array IC 43 includes a constant current source circuit (current adjustment part) 44, and the constant current source circuit 44 is connected to a signal output line 51. The constant current source circuit 44 is set so as to draw, from the signal output line 51, a current approximately equalized with a bias current $I_B$ which flows to an amplifier transistor 16 when zero charge is stored in a charge storage part 14 of the pixel 12.

The above-described configuration allows obtainment of substantially the same effects as those in a case using the resistor array IC 41 like the first embodiment.

[Third Embodiment]

Still another embodiment of the present invention will be described. Note that, for convenience of illustration, members having the same functions as those described in the above embodiments are denoted by the same reference characters and that a description thereof will be omitted.

Figure 4:
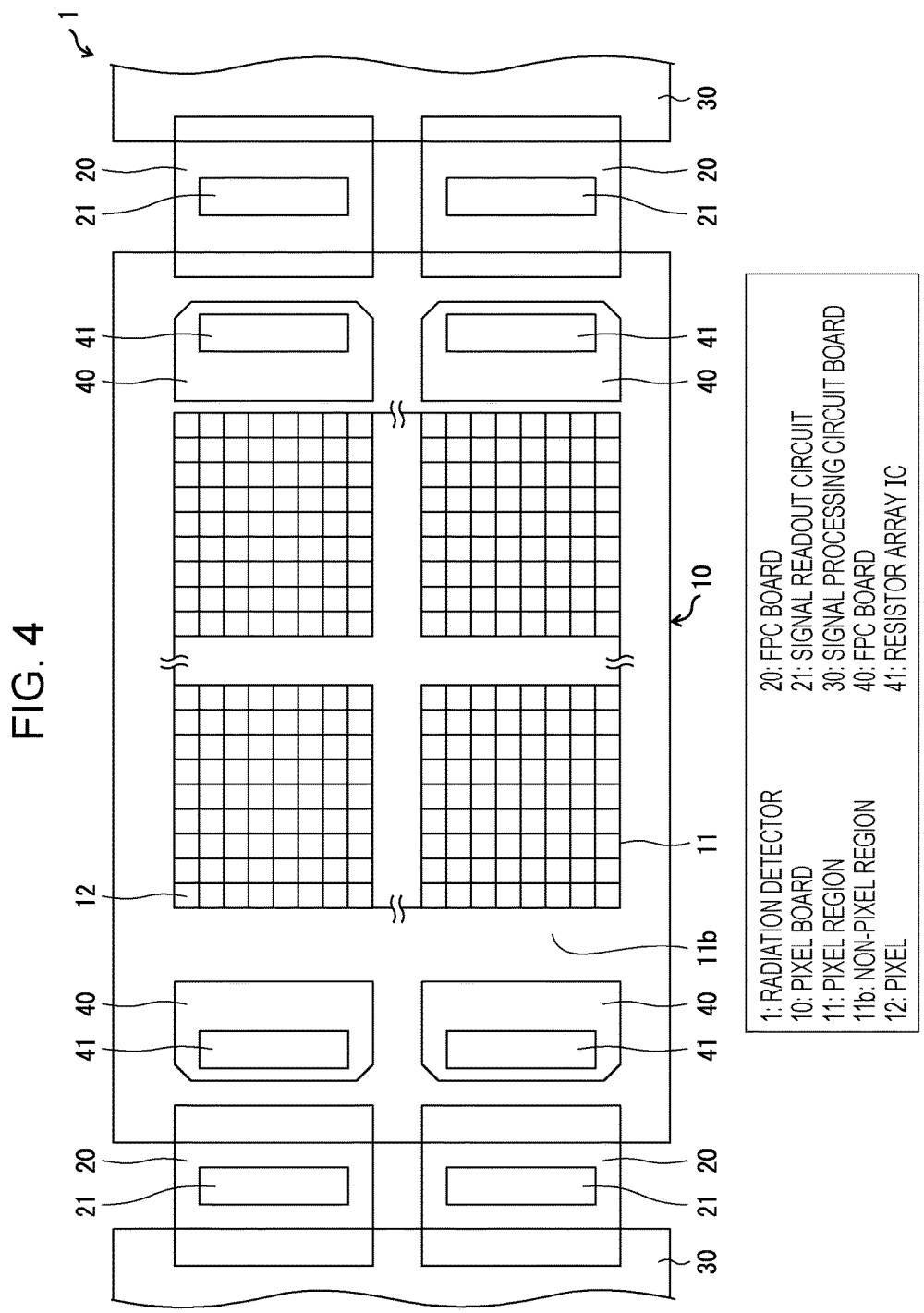
FIG. 4 is an explanatory diagram showing a schematic configuration of a radiation detector according to a third embodiment of the present invention.

FIG. 4 is an explanatory diagram showing a schematic configuration of a radiation detector 1 according to the present embodiment. As shown in the diagram, in the present embodiment, an FPC board 40 having a resistor array IC 41 and an FPC board 20 having a signal readout circuit 21 are connected to each of one end side and the other end side in a longitudinal direction of a pixel board 10. The signal readout circuit 21 arranged on the one end side and the signal readout circuit 21 arranged on the other end side are connected to separate signal processing circuit boards 30.

A signal output line 51 (see FIG. 2) connected to each pixel 12 extends along the longitudinal direction of the pixel board 10, as in the first embodiment. An output signal from each pixel 12 is output to the signal readout circuit 21 closer to the pixel 12 via the signal output line 51 and is read out.

Note that each signal output line 51 may extend from one end side of a pixel region 11 to the other end side or may extend from the signal readout circuit 21 that reads out an output signal from the pixel 12 which is output via the signal output line 51 to a central portion of the pixel region 11. That is, the signal output lines 51 may be formed to be divided into the signal output lines 51 that extend from a center in the longitudinal direction of the pixel board 10 to the one end side in the longitudinal direction and the signal output lines 51 that extend from the center in the longitudinal direction of the pixel board 10 to the other end side in the longitudinal direction.

In a case where the resistance of the signal output line 51 inside the pixel region 11 is relatively high (for example, a case where the size of the pixel region 11 is large), if the signal readout circuits 21 are arranged only on one end side in an extension direction of the signal output lines 51, amounts of voltage drop may differ in accordance with the distance from the pixel 12 to the signal readout circuit 21, and uniform detection accuracy over the entire pixel region 11 may not be achieved.

In contrast, in the present embodiment, the signal readout circuits 21 are provided on two ends in the extension direction of the signal output lines 51, and an output signal from each pixel 12 is read out using the signal readout circuit 21 closer to the pixel 12. This allows a reduction in influence of a voltage drop corresponding to the distance from the pixel 12 to the signal readout circuit 21. Thus, even in, for example, a large-screen radiation detector (large-screen radiation image capturing apparatus) large in the size of the pixel region 11, uniform detection accuracy over the entire pixel region 11 can be implemented.

In the present embodiment, the FPC board 40 including the resistor array IC 41 is connected to the outside of the pixel region 11 in the pixel board 10. This configuration reduces a change in temperature of each pixel 12 due to heat generation by the resistor array IC 41 and allows stabilization of the operation of each pixel 12, as in the first embodiment.

Note that the configuration shown in FIG. 4 may include a constant current source array IC 43 instead of the resistor array IC 41 and that substantially the same effects can be obtained in that case.

[Fourth Embodiment]

Yet another embodiment of the present invention will be described. Note that, for convenience of illustration, members having the same functions as those described in the above embodiments are denoted by the same reference characters and that a description thereof will be omitted.

Figure 5:
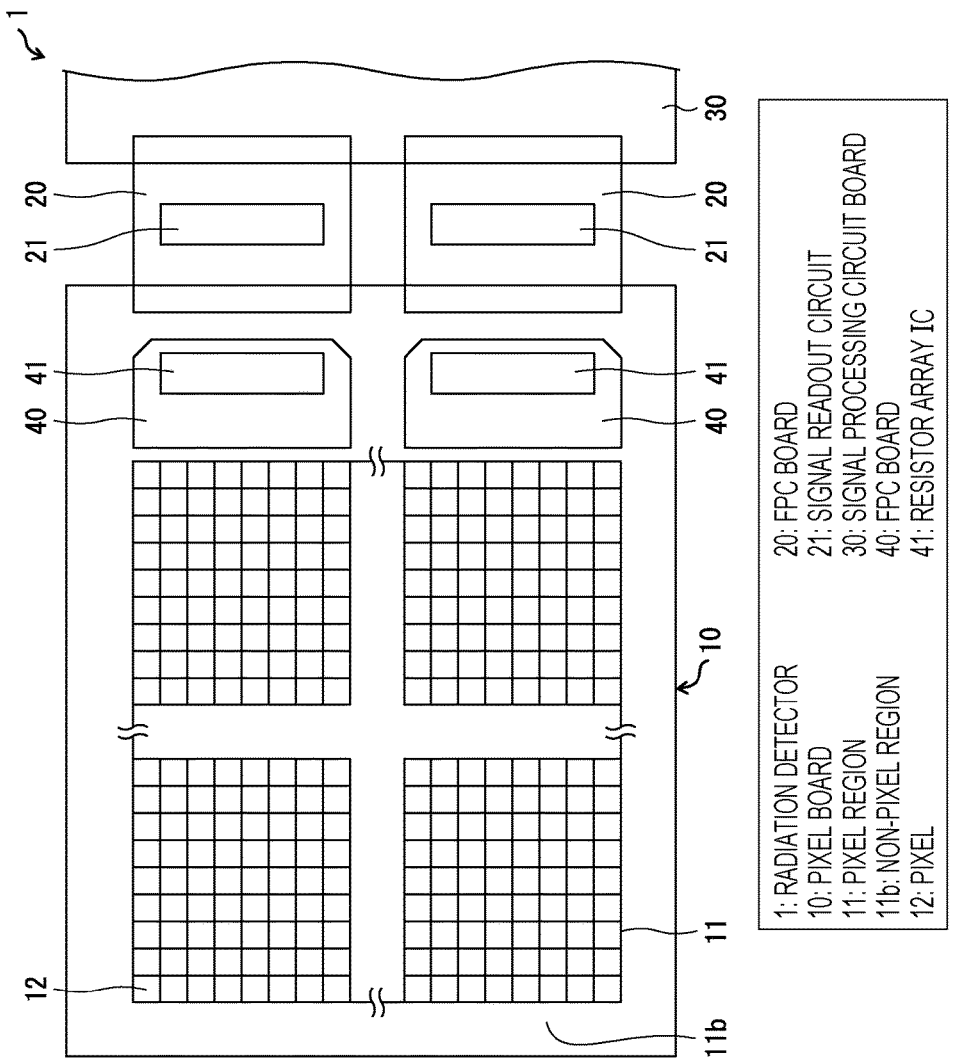
FIG. 5 is an explanatory diagram showing a schematic configuration of a radiation detector according to a fourth embodiment of the present invention.

FIG. 5 is an explanatory diagram showing a schematic configuration of a radiation detector 1 according to the present embodiment. As shown in the diagram, in the present embodiment, an FPC board 40 having a resistor array IC 41 and an FPC board 20 having a signal readout circuit 21 are connected to one end side in a longitudinal direction of a pixel board 10.

The above-described configuration allows obtainment of substantially the same effects as those in the first embodiment. The distance between the resistor array IC 41 and the signal readout circuit 21 can be made shorter than in the configuration illustrated in the first embodiment. It is thus possible to shorten a wiring routing distance and simplify a wiring structure.

Note that the configuration shown in FIG. 5 may include a constant current source array IC 43 instead of the resistor array IC 41 and that substantially the same effects can be obtained in that case.

[Fifth Embodiment]

Yet another embodiment of the present invention will be described. Note that, for convenience of illustration, members having the same functions as those described in the above embodiments are denoted by the same reference characters and that a description thereof will be omitted.

Figure 6:
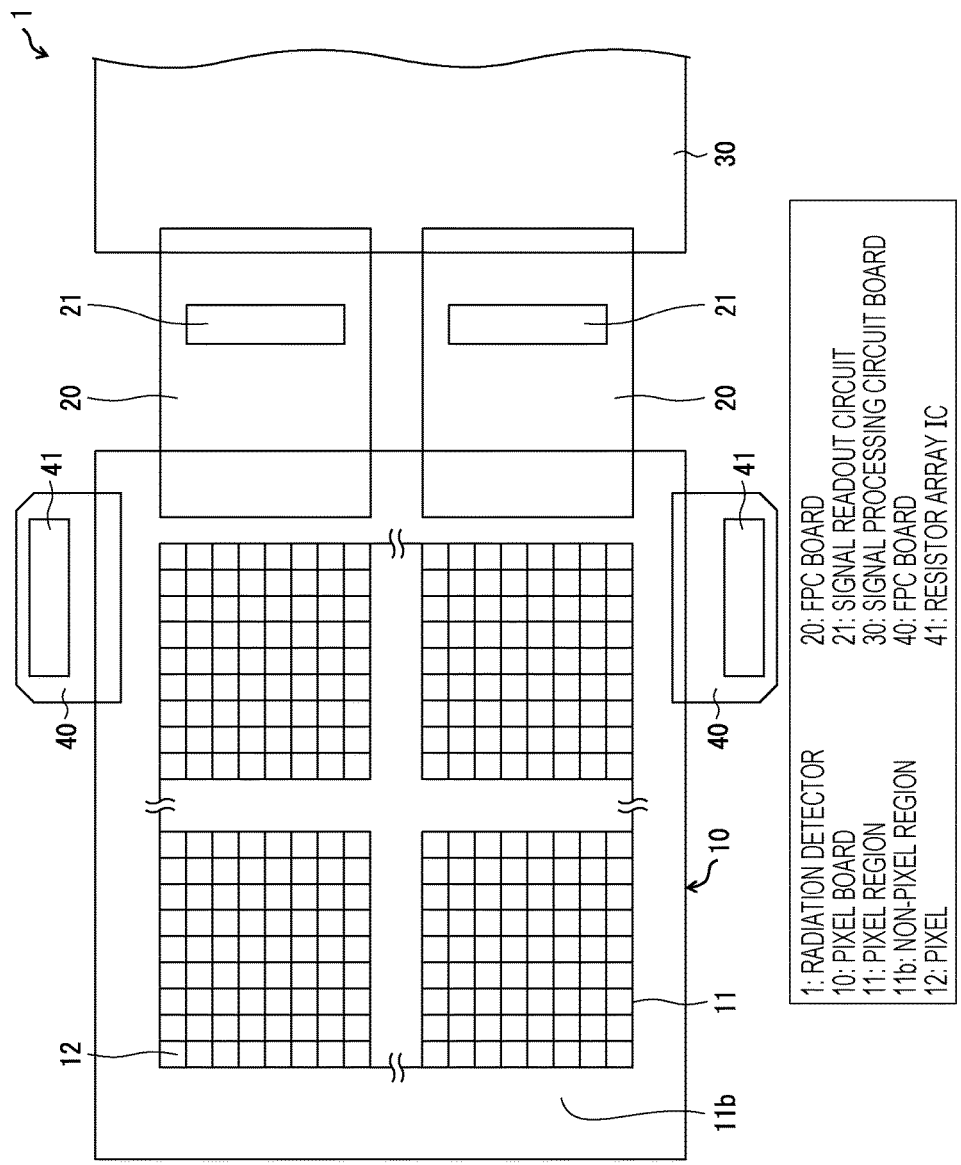
FIG. 6 is an explanatory diagram showing a schematic configuration of a radiation detector according to a fifth embodiment of the present invention.
Figure 7:
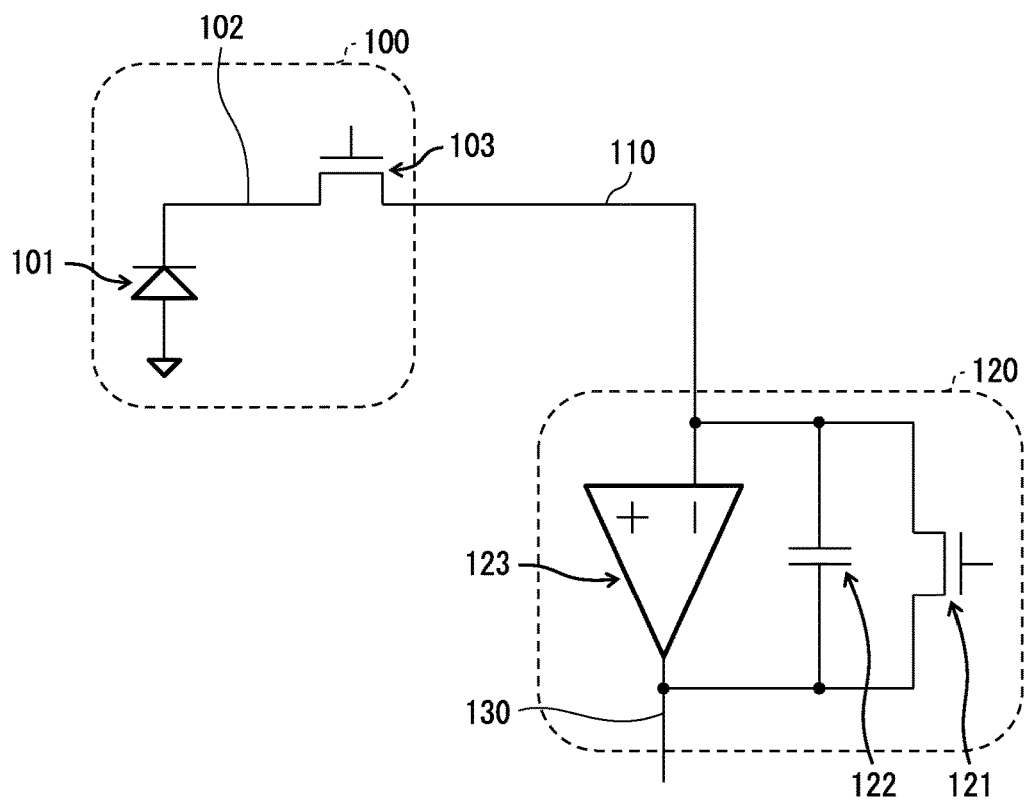
FIG. 7 is an explanatory diagram showing an example of the configurations of a pixel and a readout circuit included in a conventional radiation detector based on a PPS method.
Figure 8:
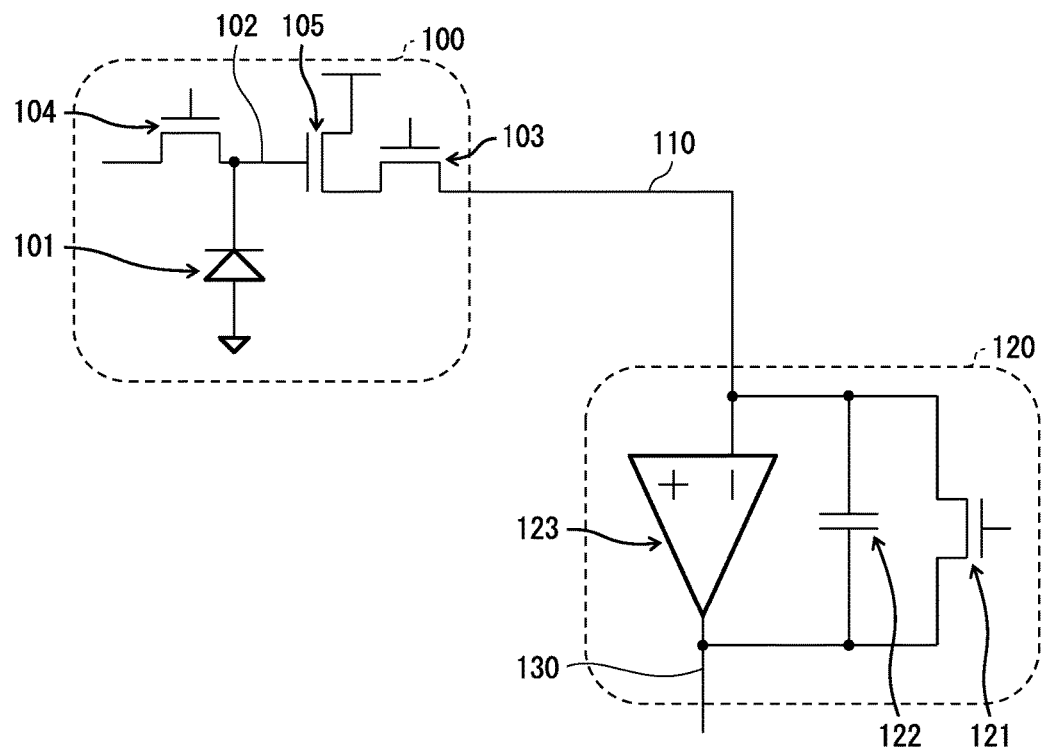
FIG. 8 is an explanatory diagram showing an example of the configurations of a pixel and a readout circuit when the readout circuit shown in FIG. 7 is applied to a radiation detector based on an APS method.

FIG. 6 is an explanatory diagram showing a schematic configuration of a radiation detector 1 according to the present embodiment. As shown in the diagram, in the present embodiment, an FPC board 20 having a signal readout circuit 21 is formed on one end side in a longitudinal direction of a pixel board 10, and FPC boards 40 having resistor array ICs 41 are connected to two end sides in a lateral direction.

The above-described configuration allows obtainment of substantially the same effects as those in the first embodiment. The distance between the resistor array IC 41 and the signal readout circuit 21 can be made shorter than in the configuration illustrated in the first embodiment. It is thus possible to shorten a wiring routing distance and simplify a wiring structure.

Note that the configuration shown in FIG. 6 may include a constant current source array IC 43 instead of the resistor array IC 41 and that substantially the same effects can be obtained in that case.

Although each of the above-described embodiments has described a configuration in which the photodiode 13 included in each pixel 12 detects light (radiation), an object, to which the present invention is to be applied, is not limited to this. The present invention can also be applied to a configuration in which charge corresponding to the dose of incident light (radiation) is stored in the charge storage part 14 by a different method. The circuit configurations illustrated in the embodiments are merely illustrative, and the present invention is not limited to the above-described circuit configurations.

Although each of the embodiments has described a configuration in which a current approximately equalized with the bias current $I_B$ of the amplifier transistor 16 is fed from the signal output line 51 to the resistor 42 (or the constant current source circuit 44 draws the current from the signal output line 51), the present invention is not limited to this. For example, in the case of a configuration in which the amplifier transistor 16 draws the bias current $I_B$ from the charge storage part 14, a current having a predetermined value corresponding to the bias current $I_B$ of the amplifier transistor 16 may be fed into the signal output line 51.

[Overview]

The radiation detector 1 according to a first aspect of the present invention is the radiation detector 1 including the pixel 12 having the charge storage part 14 that stores charge corresponding to the dose of radiation and a current signal generation part (the amplifier transistor 16) which generates a current signal corresponding to the amount of charge stored in the charge storage part 14, the signal output line 51 that is connected to the pixel 12, and the signal readout circuit 21 that reads out the current signal input from the pixel 12 via the signal output line 51. The radiation detector 1 includes a current adjustment part (the resistor 42 or the constant current source circuit 44) which is connected to a region between the pixel 12 and the signal readout circuit 21 in the signal output line 51. The current adjustment part (the resistor 42 or the constant current source circuit 44) draws or feeds, from or into the signal output line 51, a current approximately equivalent to a bias current which flows to the current signal generation part (the amplifier transistor 16) when no charge is stored in the charge storage part 14.

According to the above-described configuration, influence of the bias current flowing to the current signal generation part (the amplifier transistor 16) on the current signal input to the signal readout circuit 21 can be eliminated by simply connecting the current adjustment part (the resistor 42 or the constant current source circuit 44) to the signal output line 51. This allows widening of a detectable range for the current signal corresponding to the amount of charge stored in the charge storage part 14.

The radiation detector 1 according to a second aspect of the present invention, in the first aspect, includes the pixel board 10 having a plurality of pixels 12 formed thereon, and the current adjustment part (the resistor 42 or the constant current source circuit 44) is formed separately from the pixel board 10 and is connected to the pixel board 10.

According to the above-described configuration, the detectable range for the current signal corresponding to the amount of charge stored in the charge storage part 14 can be widened by simply connecting the current adjustment part (the resistor 42 or the constant current source circuit 44) to the existing pixel board 10 and signal output line 51.

In the radiation detector 1 according to a third aspect of the present invention, in the second aspect, the pixel region 11 having the plurality of pixels 12 formed therein and the non-pixel region 11b without the pixel 12 are formed on a board surface of the pixel board 10, the pixel region 11 is arranged at a central portion of the board surface, the non-pixel region 11b is arranged around a peripheral portion of the board surface, and the current adjustment part (the resistor 42 or the constant current source circuit 44) is connected to the non-pixel region 11b of the pixel board 10.

According to the above-described configuration, even if heat is generated in the current adjustment part (the resistor 42 or the constant current source circuit 44), each pixel 12 can be made to operate stably by reducing a change in temperature of each pixel 12 formed in the pixel region 11.

In the radiation detector 1 according to a fourth aspect of the present invention, in any of the first to third aspects, the current adjustment part is the resistor 42 or the constant current source circuit 44.

According to the above-described configuration, a configuration for drawing or feeding, from or into the signal output line 51, the current approximately equivalent to the bias current flowing to the current signal generation part (the amplifier transistor 16) can be easily implemented.

The radiation detector 1 according to a fifth aspect of the present invention, in any of the first to fourth aspects, includes the pixel board 10 having a plurality of pixels 12 formed thereon, the signal readout circuit 21 is formed separately from the pixel board 10 and is connected to the pixel board 10, the pixel region 11 having the plurality of pixels 12 formed therein and the non-pixel region 11b without the pixel 12 are formed on a board surface of the pixel board 10, the separate signal readout circuits 21 are connected to positions on two end sides of the pixel board 10 which face each other across the pixel region 11 in the non-pixel region 11b, and each of the pixels 12 outputs, via the signal output line 51, the current signal to the signal readout circuit 21 closer to the pixel 12 of the signal readout circuits 21 arranged across the pixel region 11 from each other.

According to the above-described configuration, it is possible to reduce the influence of a voltage drop corresponding to a distance from the pixel 12 to the signal readout circuit 21 in the signal output line 51 on signal detection accuracy of the signal readout circuit 21. Thus, for example, even if the size of the pixel region 11 is large, uniform detection accuracy over the entire pixel region 11 can be achieved.

The present invention is not limited to the above-described embodiments, and various changes may be made within the scope of the claims. An embodiment obtained by appropriately combining the technical means disclosed in different embodiments is also encompassed in the technical scope of the present invention. Additionally, a new technical feature can be formed by combining the technical means disclosed in the embodiments.

REFERENCE SIGNS LIST 1 radiation detector
10 pixel board
11 pixel region
11b non-pixel region
12 pixel
13 photodiode
14 charge storage part
15 pixel reset switch
16 amplifier transistor (current signal generation part)
17 readout switch
20 FPC board
21 signal readout circuit
22 readout amplifier
23 feedback capacitor
24 amplifier reset switch
30 signal processing circuit board
40 FPC board
41 resistor array IC
42 resistor (current adjustment part)
43 constant current source array IC
44 constant current source circuit (current adjustment part)
51 signal output line
52 resistor-connecting line
53 readout amplifier output line

The invention claimed is:

1. A radiation detector comprising:
a pixel having a charge storage part which stores charge corresponding to the dose of radiation and a current signal generation part which generates a current signal corresponding to the amount of charge stored in the charge storage part;
a signal output line which is connected to the pixel; and
a signal readout circuit which reads out the current signal input from the pixel via the signal output line, wherein
the radiation detector includes a current adjustment part which is connected to a region between the pixel and the signal readout circuit in the signal output line, and
the current adjustment part draws or feeds, from or into the signal output line, a current approximately equivalent to a bias current which flows to the current signal generation part when no charge is stored in the charge storage part.

2. The radiation detector according to claim 1, wherein
the radiation detector includes a pixel board having a plurality of pixels formed thereon which constitute the pixel, and
the current adjustment part is formed separately from the pixel board and is connected to the pixel board.

3. The radiation detector according to claim 2, wherein
a pixel region having the plurality of pixels formed therein and a non-pixel region without the pixel are formed on a board surface of the pixel board,
the pixel region is arranged at a central portion of the board surface, and the non-pixel region is arranged around a peripheral portion of the board surface, and
the current adjustment part is connected to the non-pixel region of the pixel board.

4. The radiation detector according to claim 1, wherein the current adjustment part is a resistor or a constant current source circuit.

5. The radiation detector according to claim 1, wherein
the radiation detector includes a pixel board having a plurality of pixels formed thereon which constitute the pixel,
the signal readout circuit is formed separately from the pixel board and is connected to the pixel board,
a pixel region having the plurality of pixels formed therein and a non-pixel region without the pixel are formed on a board surface of the pixel board,
separate signal readout circuits which constitute the signal readout circuit are connected to positions on two end sides of the pixel board which face each other across the pixel region in the non-pixel region, and
each of the pixels outputs, via the signal output line, the current signal to the signal readout circuit closer to the pixel of the signal readout circuits arranged across the pixel region from each other.

* * * * *